United States Patent
Lee

(10) Patent No.: US 7,585,774 B2
(45) Date of Patent: Sep. 8, 2009

(54) METHOD FOR FABRICATING METAL LINE OF SEMICONDUCTOR DEVICE

(75) Inventor: Kang-Hyun Lee, Yongin (KR)

(73) Assignee: Dongbu Electroncis Co., Ltd., Seoul (KR)

( * ) Notice: Subject to any disclaimer, the term of this patent is extended or adjusted under 35 U.S.C. 154(b) by 946 days.

(21) Appl. No.: 10/728,706

(22) Filed: Dec. 5, 2003

(65) Prior Publication Data

US 2004/0121580 A1   Jun. 24, 2004

(30) Foreign Application Priority Data

Dec. 24, 2002   (KR) .................. 10-2002-0083530

(51) Int. Cl.
*H01L 21/302* (2006.01)
(52) U.S. Cl. .................. 438/706; 257/E21.516
(58) Field of Classification Search ................ 438/720, 438/622, 624, 637, 780, 706, 736
See application file for complete search history.

(56) References Cited

U.S. PATENT DOCUMENTS

| | | | |
|---|---|---|---|
| 5,935,762 A | 8/1999 | Dai et al. | |
| 6,006,764 A | 12/1999 | Chu et al. | |
| 6,103,596 A * | 8/2000 | Peng | 438/439 |
| 6,184,148 B1 | 2/2001 | Nakamura | |
| 6,316,329 B1 | 11/2001 | Hirota et al. | |
| 6,383,942 B1 * | 5/2002 | Narita et al. | 438/720 |
| 6,475,811 B1 * | 11/2002 | Babcock | 438/1 |
| 6,750,150 B2 * | 6/2004 | Chung et al. | 438/706 |
| 6,764,957 B2 * | 7/2004 | Yu | 438/725 |
| 2003/0034325 A1 * | 2/2003 | Hart et al. | 216/27 |
| 2004/0018450 A1 * | 1/2004 | Fang et al. | 430/313 |

* cited by examiner

*Primary Examiner*—David S Blum
(74) *Attorney, Agent, or Firm*—The Law Offices of Andrew D. Fortney; Andrew D. Fortney

(57) ABSTRACT

The present invention is directed to a method for fabricating a metal line of a semiconductor device. The method comprises the steps of forming an insulation layer, a metal layer and an organic anti-reflection coating in order on a semiconductor substrate on which devices or lower lines are formed, forming a photoresist pattern having an opening of certain width on the organic anti-reflection coating, forming a buffer layer of certain thickness on the photoresist pattern, and selectively removing the metal layer at a lower side of the opening by performing a dry etching process.

2 Claims, 2 Drawing Sheets

METHOD FOR FABRICATING METAL LINE OF SEMICONDUCTOR DEVICE

BACKGROUND OF THE INVENTION (a) Field of the Invention

The present invention relates to a fabrication method of a semiconductor device, and more particularly to a method for fabricating a metal line of the semiconductor device, which is capable of reducing the height of a photoresist pattern and improving a photo margin.

(b) Description of the Related Art

A metal line to play an important role of power supply in a semiconductor device is a critical factor for determining a yield, operation speed and reliability of the device, and so, a technique for fabricating the metal line becomes increasingly important as a degree of integration of the device becomes high.

In general, the metal line of the semiconductor device is formed by forming a metal film by depositing aluminum or aluminum/copper alloy on a semiconductor substrate by means of a sputtering or evaporation method, and then patterning the metal film using a wet or dry etching method.

Recently, the dry etching method is being mainly used as the degree of integration of the semiconductor device becomes high.

The dry etching method uses plasma made by using special gases such as $SiCl_4$, $BCl_3$, $Cl_2$, etc. Particularly, in forming the pattern of the metal line, the dry etching is performed by chemical reaction of chlorine radical (Cl) formed by the plasma with aluminum existing on a surface of a thin film for the metal line.

Now, a conventional general metal line fabrication method will be described as below.

First, an insulation layer is formed by depositing an oxide film on a semiconductor substrate on which devices or lower lines and the like are formed, and then an aluminum metal layer is formed on the insulation layer.

Subsequently, a photoresist pattern having openings of certain width is formed on the aluminum metal layer, a partial region of the aluminum metal layer is removed by dry etching using the photoresist pattern as a mask, and then the photoresist pattern is removed to form an aluminum metal line.

Examples of techniques for fabricating the metal line as described above are disclosed in U.S. Pat. Nos. 5,935,762, 6,006,764, 6,184,148, and 6,316,329.

However, for the fabrication of the metal line using the photoresist pattern, it is the biggest problem that the dry etching process has a bad selectivity with the photoresist.

Therefore, conventionally, the photoresist has to be formed at more than about 9,000 Å when a metal line having a critical dimension (CD) of less than 0.23 μm is to be formed.

However, a problem arises in that a random metal bridge phenomenon frequently occurs due to decrease of a photo margin as the photoresist pattern becomes thicker, and, to the contrary, when the photoresist pattern becomes thinner to increase the photo margin, a notching phenomenon occurs due to scarcity of the photo margin.

SUMMARY OF THE INVENTION

In considerations of the above problem, it is an object of the present invention to provide a method for fabricating a metal line of a semiconductor, which is capable of improving a photo margin while reducing the height of a photoresist pattern.

To achieve the object, according to an aspect of the present invention, there is provided a method for fabricating a metal line wherein a buffer layer is applied on a photoresist pattern having openings of certain width and then a metal line is formed by performing a dry etching process.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENT

A preferred embodiment of the present invention will now be described in detail with reference to the accompanying drawings.

Figure 1:
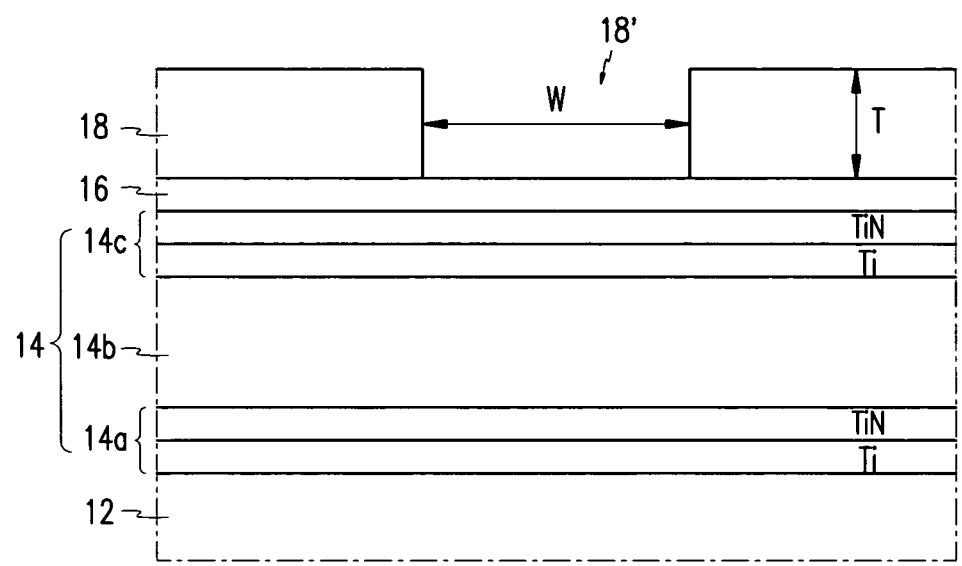
FIGS. 1 to 3 are views for illustrating a method for fabricating a metal line, according to an embodiment of the present invention.
Figure 2:
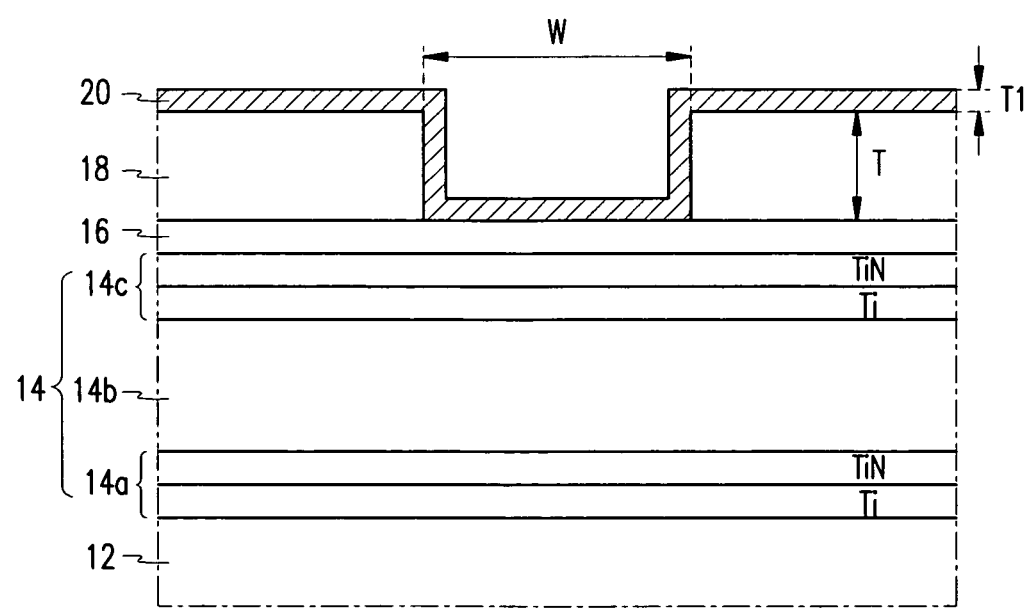
Figure 3:
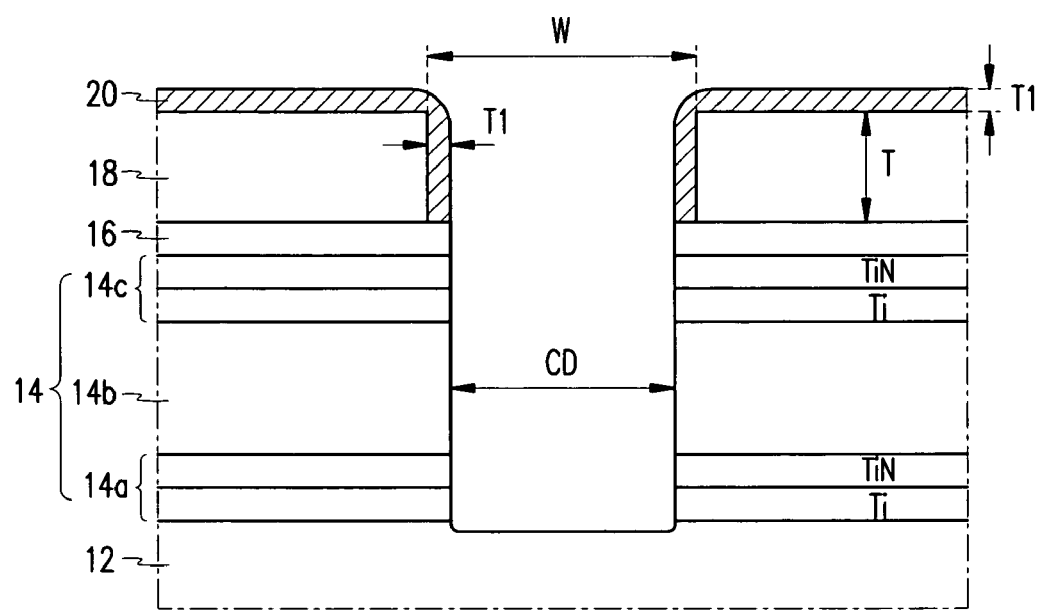

FIGS. 1 to 3 are views for illustrating a method for fabricating a metal line, according to an embodiment of the present invention.

As shown in FIG. 1, an insulation layer 12 is formed by depositing an oxide film on a semiconductor substrate on which devices or lower lines and the like are formed. And, a lower metal layer 14a made of TiN/Ti, an intermediate metal layer 14b made of Al—Cu and an upper metal layer 14c made of TiN/Ti are layered in order above the insulation layer.

Here, the lower metal layer 14a functions as a barrier layer and the upper metal layer 14c functions as a capping layer. In addition, an organic anti-reflection coating (ARC) 16 is layered on the upper metal layer 14c and the photoresist pattern 18 is provided on the organic anti-reflection coating 16.

The photoresist pattern 18 is formed by applying a photoresist film on the organic anti-reflection coating 16, exposing the photoresist film using a photomask in which a predetermined circuit pattern is formed as a mask, and developing the exposed photoresist film.

The photoresist pattern 18 formed by the above-described method has an opening 18' of certain width W, which is an important factor for determining a critical dimension (CD) of the metal line 14.

In this embodiment, the photoresist pattern 18 is formed at the width W larger than that in the prior art and is formed at the thickness T smaller than that in the prior art.

Particularly, in the prior art, in order to form the metal line 14 having the critical dimension (CD) of less than 0.23 μm, considering the selectivity at the time of dry etching, the opening of the photoresist pattern 18 has to be formed at the same width W as the critical dimension (CD) of the metal line 14 and the photoresist pattern 18 has to be formed at the thickness T of more than 9,000 Å, preferably, 9,500 Å.

However, in this embodiment, when the metal line 18 having the critical dimension (CD) of less than 0.23 μm is formed, the opening of the photoresist pattern 18 can be formed at the width W more than that in the prior art, for example, 0.26 μm and the photoresist pattern 18 can be formed at the thickness T of less than 9,000 Å.

This can be achieved by a buffer layer application process, which will be described later.

After the photoresist pattern 18 having the opening 18 of certain width W is formed as shown in FIG. 1, a buffer layer 20 is formed on the pattern 18 as shown in FIG. 2. Here, the buffer layer 20, which can be made of an oxide film of PE family, is layered at a thickness T1 of 180 to 230 Å, preferably, 200 Å. The reason why the oxide film of PE family is used as the buffer layer 20 is to have no effect on various subsequent layering processes, which are carried out after the etching process is completed.

Subsequently, when a dry etching is performed, the buffer layer 20, the organic anti-reflection coating 16, the upper metal layer 14c, the intermediate layer 14b and the lower metal layer 14a under the opening W are etched in order until a top surface of the insulation layer 12 is exposed, as shown in FIG. 3. Here, a plasma etching using $Cl_2/BCl_3$ gases is used as the dry etching.

On the other hand, when the dry etching is performed, the critical dimension (CD) of the metal line 14, i.e., the etching width of the upper, intermediate and lower metal layers 14c, 14b and 14a, is set in association with the thickness of the buffer layer 20 provided at an inner side wall of the opening W.

Namely, the critical dimension (CD) is set as a dimension of the subtraction of twice the thickness T1 of the buffer layer from the width W of the opening 18 $\{CD=W-(2\times T1)\}$.

Accordingly, even when the opening of the photoresist pattern 18 is formed at the width W of 0.26 μm, the metal line 14 can be formed at the critical dimension (CD) of less than 0.23 μm due to the buffer layer 20 formed at the inner side wall of the opening 18'.

Next, although not shown, after the dry etching is completed, an ashing process is performed to remove the buffer layer 20, the photoresist pattern 18 and the organic anti-reflection coating 16 for forming the metal line 14.

When the metal line is formed according to the above-described processes, the critical dimension of the metal line can be set as the same dimension as the prior art while decreasing the thickness of the photoresist pattern and increasing the width of the opening of the photoresist pattern. Accordingly, characteristics of devices can be improved by significantly improving a photo margin in a photo process, and device yield can be improved by improving a metal bridge phenomenon.

Although a preferred embodiment of the present invention has been described in detail hereinabove, it should be clearly understood that many variations and/or modifications of the basic inventive concepts herein taught which may appear to those skilled in the presentart will still fall within the spirit and scope of the present invention, as defined in the appended claims.

What is claimed is:

1. A method for fabricating a metal line of a semiconductor device, comprising the steps of:
   a) forming an insulation layer on a semiconductor substrate on which devices or lower lines are formed;
   b) forming a metal layer on the insulation layer;
   c) forming a photoresist pattern having an opening of less than or equal to 0.26 μm width on the metal layer, wherein said photoresist has a thickness of less than 9000 Å;
   d) forming a buffer layer on the photoresist pattern, including in the opening, wherein the buffer layer comprises an oxide film of PE family; and
   e) selectively removing the metal layer at a lower side of the opening by dry etching to form a plurality of metal lines such that a dimension between adjacent metal lines is less than said certain width of said opening.

2. A method for fabricating a metal line of a semiconductor device, comprising the steps of;
   a) forming an insulation layer on a semiconductor substrate on which devices or lower lines are formed;
   b) forming a metal layer on the insulation layer;
   c) forming a photoresist pattern having an opening of less than or equal to 0.26 μm width on the metal layer, wherein said photoresist has a thickness of less than 9000 Å;
   d) forming a buffer layer on the photoresist pattern, including in the opening, wherein the buffer layer comprises an oxide film of PE family and has a thickness of 180 to 230 Å; and
   e) selectively removing the metal layer at a lower side of the opening by dry etching to form a plurality of metal lines such that a dimension between adjacent metal lines is less than said certain width of said opening.

* * * * *